(12) United States Patent
Hayashi

(10) Patent No.: US 6,929,994 B2
(45) Date of Patent: Aug. 16, 2005

(54) METHOD FOR MANUFACTURING SEMICONDUCTOR DEVICE THAT INCLUDES WELL FORMATION

(75) Inventor: Masahiro Hayashi, Sakata (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/382,102

(22) Filed: Mar. 5, 2003

(65) Prior Publication Data

US 2003/0232490 A1 Dec. 18, 2003

(30) Foreign Application Priority Data

Mar. 7, 2002 (JP) ........................................ 2002-061878

(51) Int. Cl.⁷ .......................................... H01L 21/8238
(52) U.S. Cl. ........................ 438/224; 438/197; 438/223
(58) Field of Search ........................... 438/197, 223–225, 438/227, 228, 297, 298, 546, 548, 549

(56) References Cited

U.S. PATENT DOCUMENTS

| | | | |
|---|---|---|---|
| 5,079,613 A | | 1/1992 | Sawada et al. |
| 5,110,750 A | * | 5/1992 | Yoshida .................... 438/420 |
| 5,238,860 A | * | 8/1993 | Sawada et al. ............. 438/210 |
| 5,260,226 A | * | 11/1993 | Sawada et al. ............. 438/210 |
| 5,514,889 A | * | 5/1996 | Cho et al. .................. 257/316 |
| 5,637,524 A | * | 6/1997 | Lee et al. .................... 438/448 |
| 5,693,505 A | * | 12/1997 | Kobayashi ................... 438/217 |
| 5,712,178 A | * | 1/1998 | Cho et al. .................... 438/201 |
| 5,895,251 A | * | 4/1999 | Kim ........................... 438/401 |
| 5,917,218 A | * | 6/1999 | Choi et al. ................... 257/345 |
| 6,071,775 A | * | 6/2000 | Choi et al. ................... 438/257 |
| 6,413,808 B1 | * | 7/2002 | Kokubun ..................... 438/200 |
| 6,451,640 B1 | * | 9/2002 | Ichikawa ..................... 438/199 |
| 6,455,402 B2 | * | 9/2002 | Lee et al. .................... 438/527 |
| 2002/0098638 A1 | * | 7/2002 | Yaegashi et al. ............. 438/217 |

FOREIGN PATENT DOCUMENTS

| | | |
|---|---|---|
| JP | 1-268171 | 10/1989 |
| JP | 7-078881 | 3/1995 |
| JP | 8-274268 | 10/1996 |
| JP | 2000-286346 | 10/2000 |
| JP | 2000-294742 | 10/2000 |
| JP | 2001-291678 | 10/2001 |
| JP | 2001-291679 | 10/2001 |
| JP | 2001-291786 | 10/2001 |

* cited by examiner

Primary Examiner—Lynne A. Gurley
Assistant Examiner—Stanetta Isaac
(74) Attorney, Agent, or Firm—Harness, Dickey & Pierce, P.L.C.

(57) ABSTRACT

A method is provided for manufacturing a semiconductor device having a high breakdown voltage transistor and a low breakdown voltage transistor with different driving voltages in a common substrate. The method includes: (a) introducing an impurity of a second conductivity type in a specified region of a semiconductor substrate of a first conductivity type to form a first impurity layer and a second impurity layer; (b) further introducing an impurity of the second conductivity type in a region of the second impurity layer to form a third impurity layer; and (c) conducting a heat treatment to diffuse impurities of the first impurity layer and the third impurity layer to form a first well of the second conductivity type and a second well of the second conductivity type having an impurity concentration higher than the first well.

5 Claims, 7 Drawing Sheets

METHOD FOR MANUFACTURING SEMICONDUCTOR DEVICE THAT INCLUDES WELL FORMATION

TECHNICAL FIELD

The present invention relates to a method for manufacturing a semiconductor device having a high breakdown voltage transistor and a low breakdown voltage transistor in a common semiconductor substrate.

BACKGROUND

A liquid crystal panel driver LSI and a CCD driver LSI, for example, are operated at a power supply voltage of 10V or higher, and therefore high breakdown voltage transistors having a breakdown voltage of 20V or higher are normally required. On the other hand, low breakdown voltage transistors are used in internal control logic sections that need to be small in size and operated at high speeds. Wells where high breakdown voltage transistors are formed tend to be made deeper in order to secure the well breakdown voltage. In contrast, wells where low breakdown voltage transistors are formed tend to be made shallower in order to reduce the element size and to achieve higher speeds. For this reason, high breakdown voltage transistors are formed in a chip that is different from a chip for low breakdown voltage transistors, are conventionally formed as an externally mounted circuit.

An object of the present invention is to provide a method for manufacturing a semiconductor device having a high breakdown voltage transistor and a low breakdown voltage transistor with different driving voltages in a common substrate.

SUMMARY

A method for manufacturing a semiconductor device in accordance with the present invention comprises the steps of:

(a) introducing an impurity of a second conductivity type in a specified region of a semiconductor substrate of a first conductivity type to form a first impurity layer and a second impurity layer;

(b) further introducing an impurity of the second conductivity type in a region of the second impurity layer to form a third impurity layer; and (c) conducting a heat treatment to diffuse impurity of the first impurity layer and the third impurity layer to form a first well of the second conductivity type and a second well of the second conductivity type having an impurity concentration higher than the first well.

In the manufacturing method of the present invention, a first impurity layer is formed in the step (a), a third impurity layer is formed in the steps (a) and (b), and the first well and the second well having an impurity concentration higher than the first well can be simultaneously formed by diffusing the impurity in the first impurity layer and the third impurity layer by a heat treatment in the step (c). An ion implantation can be uses as a method for introducing an impurity in the semiconductor substrate.

In the step (a), an anti-oxidation layer having a mask function against oxidation may be selectively formed on the semiconductor substrate, and the impurity of the second conductivity type may be introduced in the semiconductor substrate using the anti-oxidation layer as a first mask to form the first impurity layer and the second impurity layer.

In the step (b), the impurity of the second conductivity type may be further introduced in the region of the second impurity layer using the anti-oxidation layer and a resist layer formed on the anti-oxidation layer as a second mask to form the third impurity layer.

In accordance with this method, the anti-oxidation layer can be used as part of the first mask and the second mask, such that the number of steps of forming masks can be reduced. Then, when the second impurity layer and the third impurity layer are formed, the anti-oxidation layer also serves as a mask at the time of introducing the impurity. Therefore, no mask deviation occurs in the impurity ion implantations that are conducted twice. Therefore, an impurity can be accurately introduced in a region of the second impurity layer, and the third impurity layer can be formed in a self-alignment manner.

In the present invention, a LOCOS layer may be formed by selectively oxidizing a surface of the semiconductor substrate using the anti-oxidation layer as a mask; and after removing the anti-oxidation layer, an impurity of the first conductivity type may be introduced in the semiconductor substrate using the LOCOS layer as a mask to form a third well in the semiconductor substrate. According to this process, the first well or the second well and the third well, which form a twin-well, may be formed in a self-alignment manner.

In the present invention, a fourth well of the first conductivity type may be formed within the first well. Also, a low breakdown voltage transistor of the first conductivity type may be formed in the second well; a low breakdown voltage transistor of the second conductivity type may be formed in the fourth well; a high breakdown voltage transistor of the first conductivity type may be formed in the first well; and a high breakdown voltage transistor of the second conductivity type may be formed in the third well.

DETAILED DESCRIPTION

An embodiment of the present invention will be described below with reference to the accompanying drawings.

FIGS. 1–6 schematically show cross-sectional views concerning a method for manufacturing a semiconductor device in accordance with the present embodiment.

Figure 1:
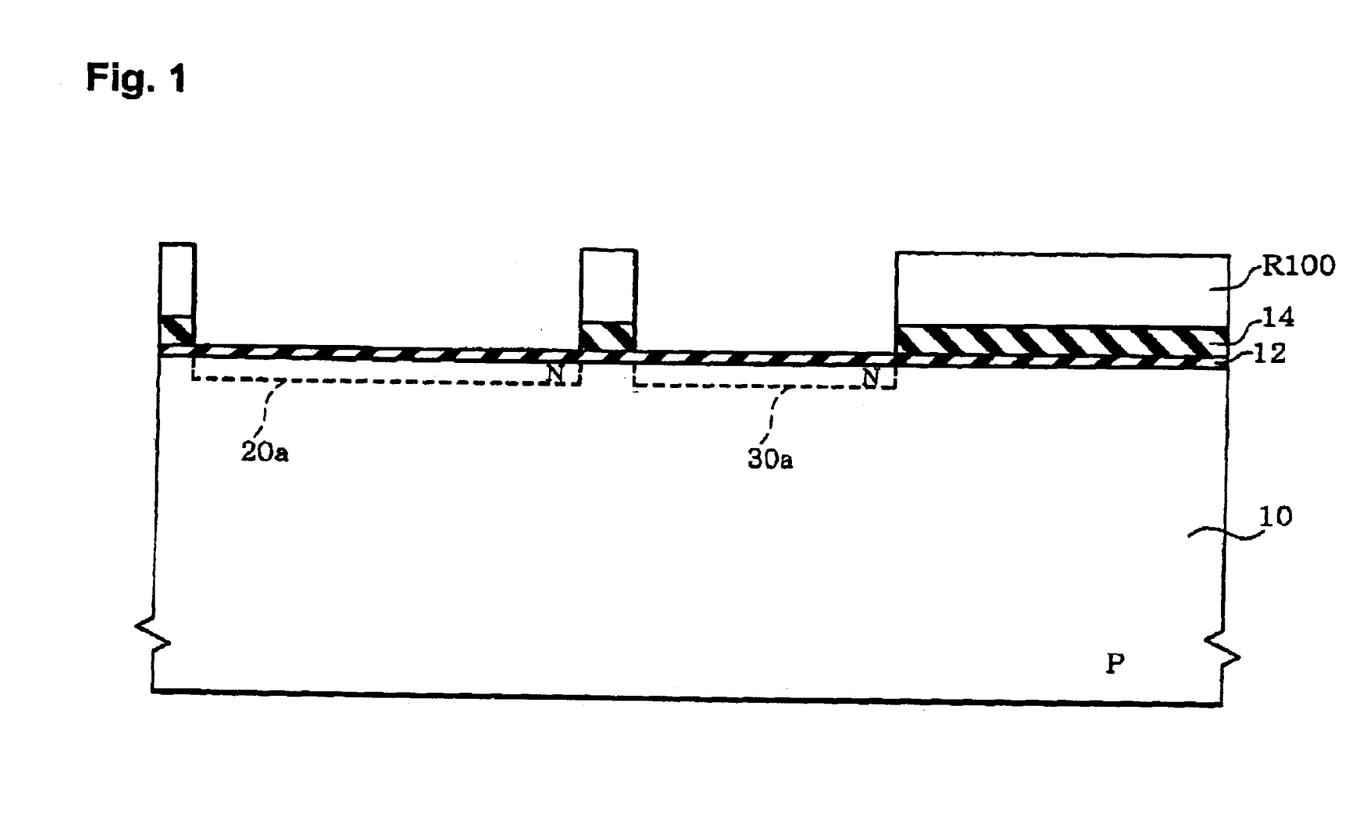
FIG. 1 shows a cross-sectional view indicating a method for manufacturing a semiconductor device in the process order in accordance with an embodiment of the present invention.

(A) As shown in FIG. 1, a semiconductor substrate 10 (e.g., of silicon) of a first conductivity type (P-type in this example) is thermally oxidized to form a silicon oxide layer 12 having a thickness of about 40 nm on a surface of the semiconductor substrate 10. Then, a silicon nitride layer 14 having a thickness of 140–160 nm as an anti-oxidation layer is formed on the silicon oxide layer 12. Then, a resist layer R100 is formed on the silicon nitride layer 14. The resist layer R100 is patterned such that opening sections are formed therein at positions corresponding to the N-type first and second wells. Then, the silicon nitride layer 14 is etched using the resist layer R100 as a mask. Then, for example, phosphorus ions are implanted in the semiconductor substrate 10 using the resist layer R100 and the silicon nitride layer (first mask) 14, to form a first impurity layer 20a and a second impurity layer 30a of a second conductivity type (N-type in this example).

Figure 2:
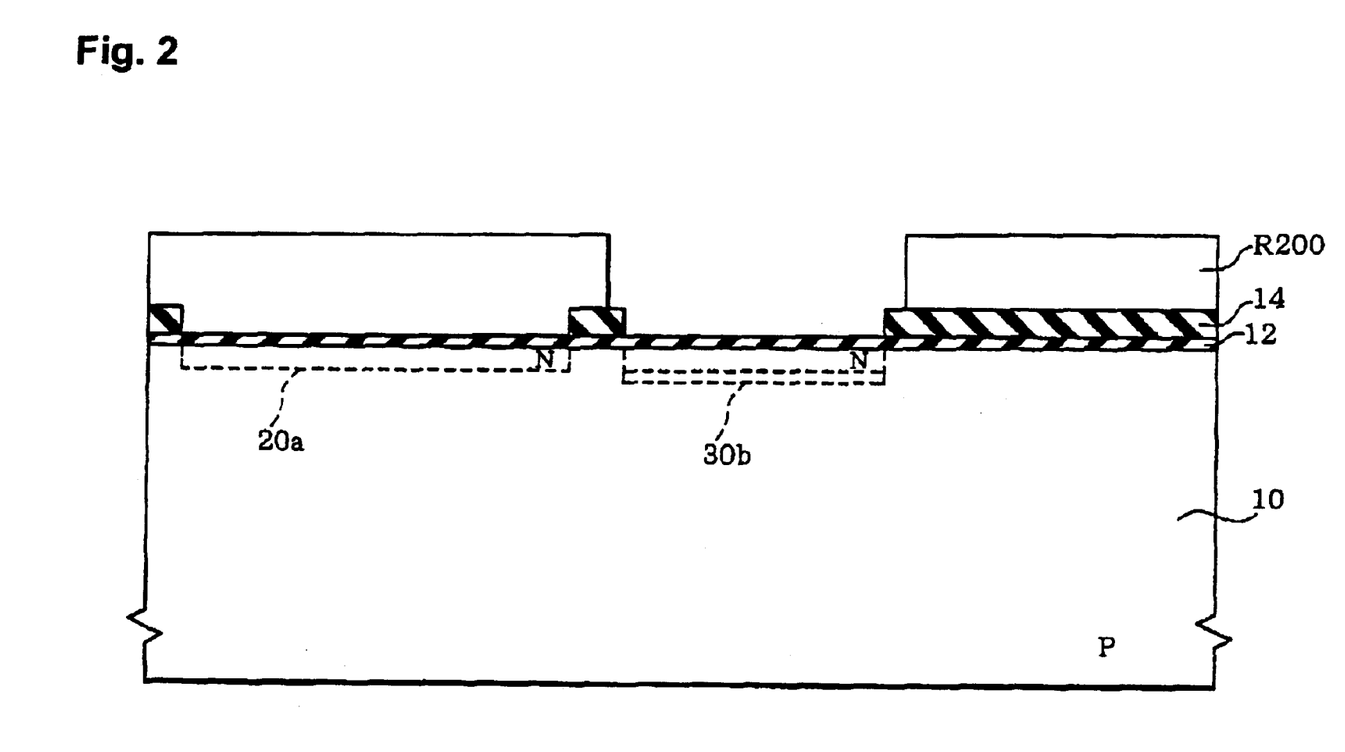
FIG. 2 shows a cross-sectional view indicating the method for manufacturing a semiconductor device in the process order in accordance with the embodiment of the present invention.

(B) As shown in FIG. 2, a resist layer R200 is formed over the silicon nitride layer 14 and the silicon oxide layer 12. The resist layer R200 is formed in a manner at least to cover the first impurity layer 20a. In the case of this example, the resist layer R200 is also formed over the silicon nitride layer 14. Since an opening section corresponding to the second impurity layer 30a (see FIG. 1) is secured by the silicon nitride layer 14, an opening section in the resist layer R200 corresponding to the second impurity layer 30a can be larger than the opening section in the silicon nitride layer 14. Therefore, patterning of the opening section in the resist layer R200 does not require a high precision, and therefore the patterning of the resist layer R200 is simplified.

Then, using the silicon nitride layer 14 and the resist layer R200 as a mask, an N-type impurity, for example, phosphorus ions are further ion-implanted in a region of the second impurity layer 30a, to form a third impurity layer 30b. In this manner, the third impurity layer 30b includes the impurity introduced in the previous step (A) and the impurity introduced in the current step (B). Therefore, the third impurity layer 30b has an impurity concentration that is higher than an impurity concentration of the first impurity layer 20a that is formed solely by the ion implantation conducted in the previous step (A).

Figure 3:
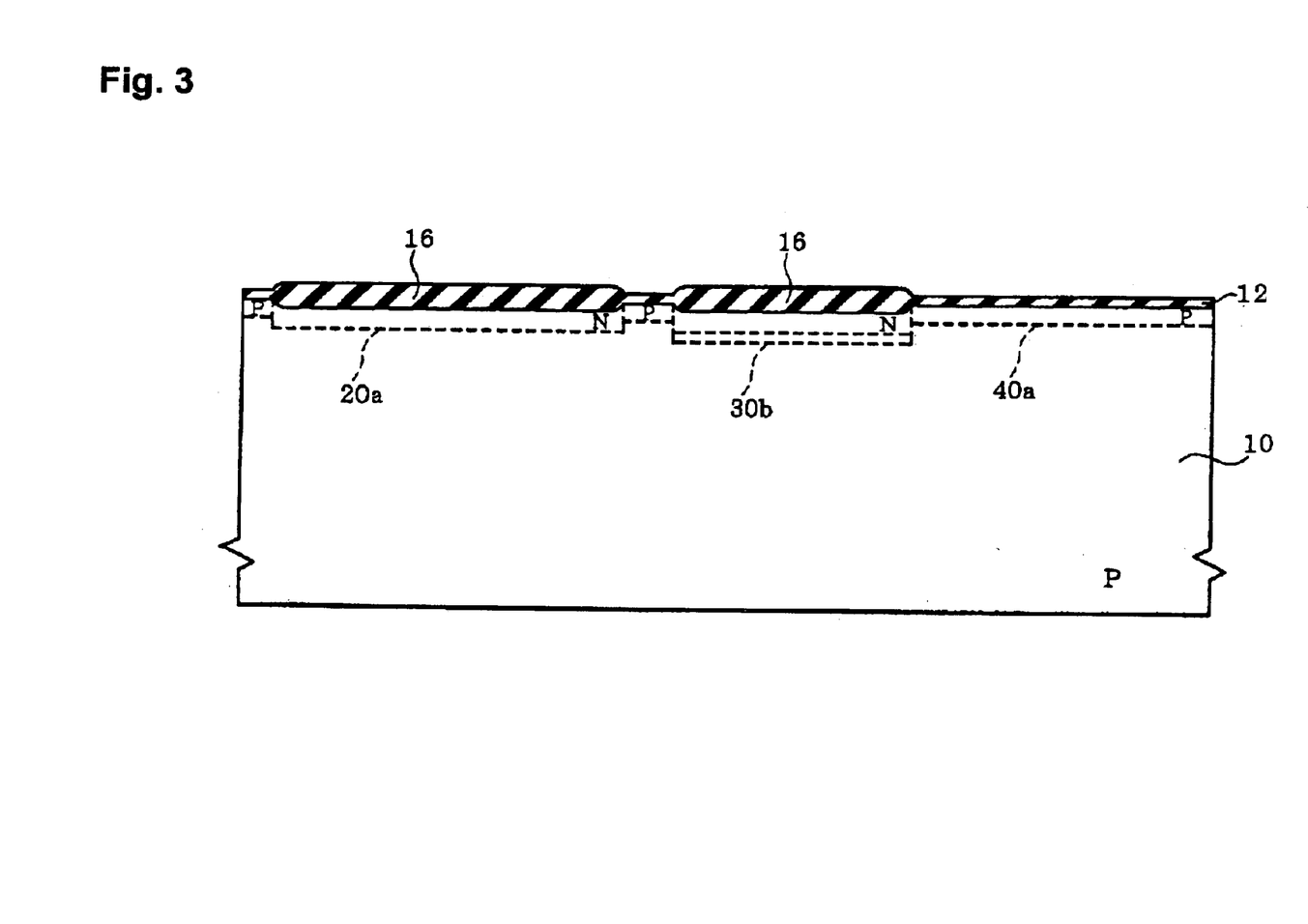
FIG. 3 shows a cross-sectional view indicating the method for manufacturing a semiconductor device in the process order in accordance with the embodiment of the present invention.

(C) As shown in FIGS. 2 and 3, after the resist layer R200 is removed, the semiconductor substrate 10 is thermally oxidized using the silicon nitride layer 14 as an antioxidation mask. As a result, a LOCOS layer 16 having a thickness of about 500 nm is formed over the N-type first impurity layer 20a and the third impurity layer 30b. Then, after removing the silicon nitride layer 14, boron ions are implanted in the semiconductor substrate 10 using the LOCOS layer 16 as a mask, to form a low concentration P-type impurity layer 40a.

Figure 4:
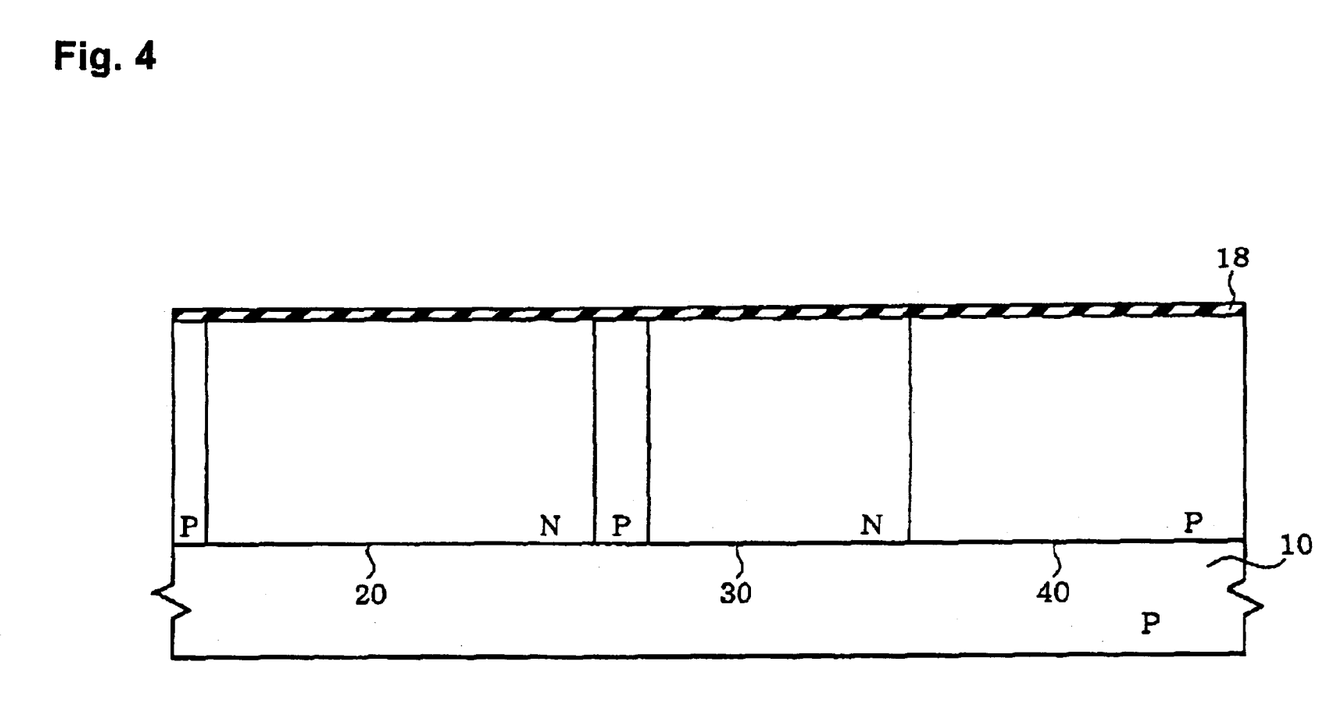
FIG. 4 shows a cross-sectional view indicating the method for manufacturing a semiconductor device in the process order in accordance with the embodiment of the present invention.

(D) As shown in FIGS. 3 and 4, after removing the silicon oxide layer 12 and the LOCOS layer 16, a silicon oxide layer 18 having a thickness of about 40 nm is formed by thermal oxidation over the semiconductor substrate 10. Then, the impurities in the N-type first impurity layer 20a and third impurity layer 30b and the P-type impurity layer 40a are diffused (driven in) by a thermal treatment, to form an N-type first well 20, an N-type second well 30 and a P-type third well 40. Impurity concentrations of these wells will be described below.

Figure 5:
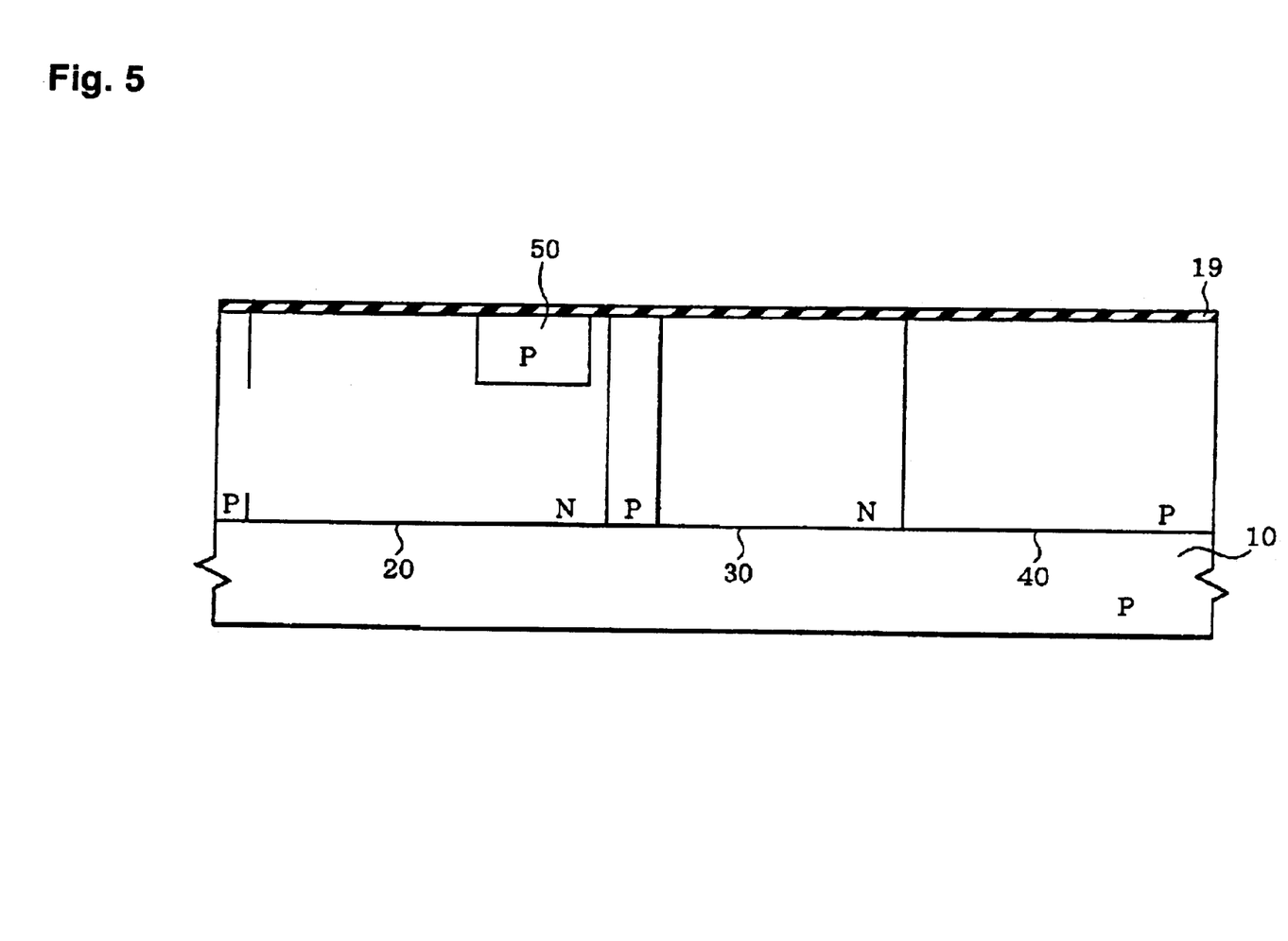
FIG. 5 shows a cross-sectional view indicating the method for manufacturing a semiconductor device in the process order in accordance with the embodiment of the present invention.

(E) As shown in FIG. 5, a P-type fourth well 50 is formed within the N-type first well 20 by a pre-selected method. More specifically, a resist layer (not shown) having an opening section at a position corresponding to the fourth well is formed on the silicon oxide layer 19. Boron ions, as one example, are implanted in a specified region of the N-type first well 20 using the resist layer as a mask, and then a heat treatment is conducted to form the high concentration P-type fourth well 50.

In this manner, the N-type first well 20, the N-type second well 30 and the P-type third well 40 are formed in the P-type semiconductor substrate 10. Further, the P-type fourth well 50 is formed within the N-type first well 20.

Figure 6:
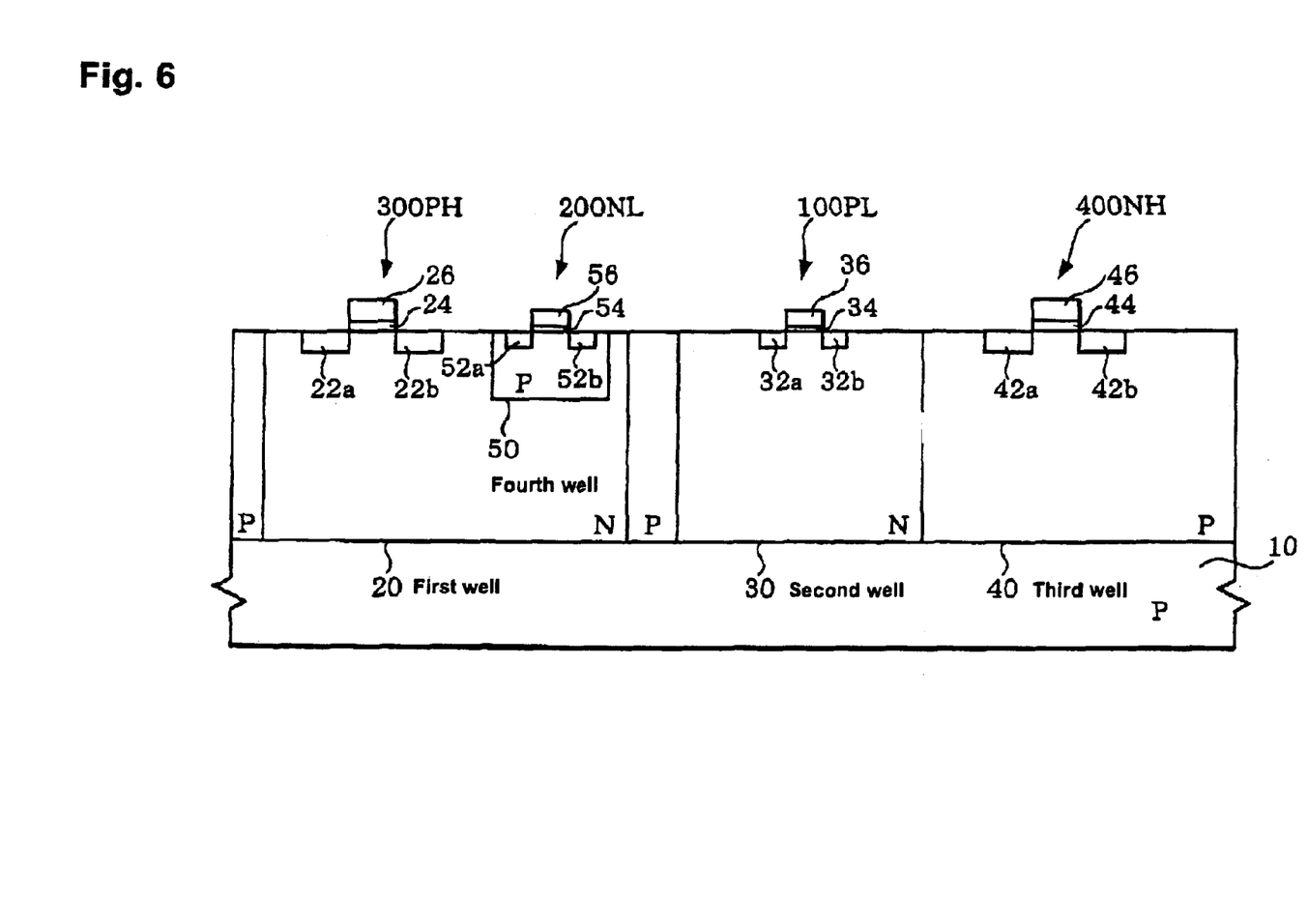
FIG. 6 shows a cross-sectional view indicating the method for manufacturing a semiconductor device in the process order in accordance with the embodiment of the present invention.

(F) As shown in FIG. 6, element isolation dielectric layers (not shown), gate dielectric layers, gate electrodes, source/drain layers and the like are formed by known methods to form specified transistors. More specifically, low breakdown voltage transistors are formed in the second well 30 and the fourth well 50, and high breakdown voltage transistors are formed in the first well 20 and the third well 30.

Even more specifically, a P-channel type low breakdown voltage transistor 100PL is formed in the second well 30. The low breakdown voltage transistor 100PL includes source/drain layers 32a and 32b composed of P-type impurity layers, a gate dielectric layer 34 and a gate electrode 36.

An N-channel type low breakdown voltage transistor 200NL is formed in the fourth well 50. The low breakdown voltage transistor 200NL includes source/drain layers 52a and 52b composed of N-type impurity layers, a gate dielectric layer 54 and a gate electrode 56.

A P-channel type high breakdown voltage transistor 300PH is formed in the first well 20. The high breakdown voltage transistor 300PH includes source/drain layers 22a and 22b composed of P-type impurity layers, a gate dielectric layer 24 and a gate electrode 26.

An N-channel type high breakdown voltage transistor 400NH is formed in the third well 40. The high breakdown voltage transistor 400NH includes source/drain layers 42a and 42b composed of N-type impurity layers, a gate dielectric layer 44 and a gate electrode 46.

The low breakdown voltage transistors 100PL and 200NL are driven by a driving voltage of, for example, 1.8–5V. The high breakdown voltage transistors 300PH and 400NH are driven by a substantially higher driving voltage as compared to those of the low breakdown voltage transistors 100PL and 200NL, for example, by a driving voltage of 20–60V. A ratio of the breakdown voltages between the low breakdown voltage transistor 100PL, 200NL and the high breakdown voltage transistor 300PH, 400NH, i.e., (a breakdown voltage of a high breakdown voltage transistor)/(a breakdown voltage of a low breakdown voltage transistor) is, for example, 3–60. The "breakdown voltage" generally means a drain breakdown voltage.

The structure of each of the wells is determined based on breakdown voltage and threshold value of transistors provided in each well and junction breakdown voltage and punch-through breakdown voltage between the wells.

Impurity concentrations of the wells will now be described. The impurity concentration of the second well 30 and fourth well 50 is set higher than the impurity concentration of the first well 20 and the third well 40. As such, the impurity concentration of each well can be appropriately set according to the driving voltage and breakdown voltage of each transistor. The impurity concentration of the second well 30 and fourth well 50 is, for example, $4.0 \times 10^{16}$–$7.0 \times 10^{17}$ atoms/cm$^3$ in their surface concentration. The impurity concentration of the first well 20 and the third well 40 is, for example, $8.0 \times 10^{15}$–$4.0 \times 10^{16}$ atoms/cm$^3$ in their surface concentration.

With respect to exemplary well depths, the first well 20 has a depth of 10–20 μm, and the fourth well 50 has a depth of 3–10 μm. As the depth of the first well 20 and the depth of the fourth well 50 are compared, a depth ratio of the two is, for example, 2–5.

The transistors shown in FIG. 6 are isolated from one another by element isolation dielectric layers (not shown). Also, each of the high breakdown voltage transistors 300PH and 400NH may have a so-called offset gate structure in which the gate electrode does not overlap the source/drain layers. In an example described below, each high breakdown voltage transistor has a LOCOS offset structure. More specifically, in each of the high breakdown voltage transistors, an offset region is provided between a gate electrode and the source/drain layers. The offset region is composed of a low concentration impurity layer below the offset LOCOS layer that is provided in a specified region on the semiconductor substrate.

Figure 7:
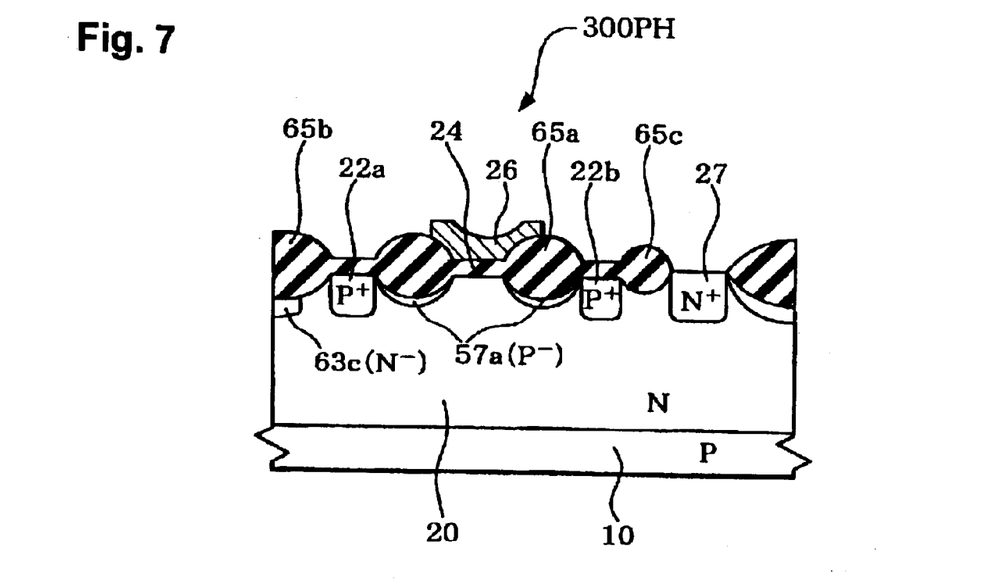
FIG. 7 shows a cross-sectional view of an exemplary structure of a high breakdown-strength transistor of a semiconductor device formed by a manufacturing method in accordance with an embodiment of the present invention.
Figure 8:
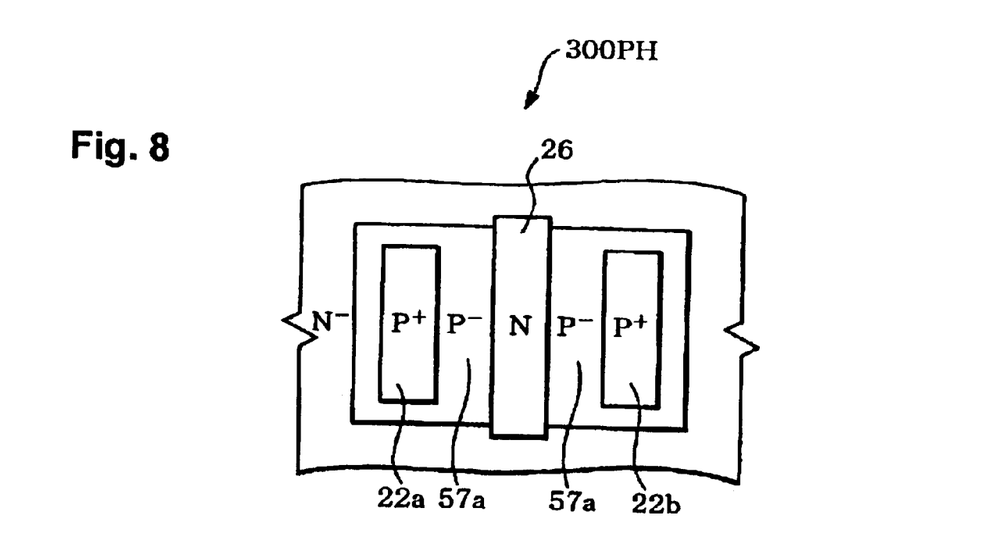
FIG. 8 shows a plan view of the main portions of the high breakdown-strength transistor shown in FIG. 7.

FIG. 7 shows, as an example of the offset gate structure, a cross-sectional view of the structure of the high breakdown voltage transistor 300PH. FIG. 8 shows a plan view of the main sections of the high breakdown voltage transistors 300PH.

The P-channel type high breakdown voltage transistor 300PH includes a gate dielectric layer 24 provided over the N-type first well 20, a gate electrode 26 formed over the gate dielectric layer 24, an offset LOCOS layer 65a provided around the gate dielectric layer 24, an offset impurity layer 57a composed of a P-type low concentration impurity layer that is formed below the offset LOCOS layer 65a, and source/drain layers 22a and 22b provided on the outside of the offset LOCOS layer 65a.

The high breakdown voltage transistor 300PH and its adjacent transistor are electrically isolated from each other by an element isolation LOCOS layer 65b (element isolation dielectric layer). Further, a channel stopper layer 63c composed of an N-type low concentration impurity layer is formed below the element isolation LOCOS layer 65b within the N-type first well 20 as shown in the drawing. A well contact layer 27 is isolated from the source/drain layer 22b by the LOCOS layer 65c. A channel stopper layer (not shown) can be formed below the LOCOS layer 65c.

Each of the high breakdown voltage transistors has a LOCOS offset structure and therefore has a high drain breakdown voltage, such that a high breakdown voltage MOSFET can be composed. In other words, by providing the offset impurity layer 57a composed of a low concentration impurity layer below the offset LOCOS layer 65a, the offset impurity layer 57a can be made relatively deep against the channel region, compared to the case without the offset LOCOS layer. As a result, when the transistor is in an OFF state, a deep depletion layer can be formed because of the offset impurity layer 57a, and a drain breakdown voltage can be increased as the electric field adjacent to the drain electrode is alleviated.

In accordance with the present embodiment, the first impurity layer 20a is formed in step (A), the second impurity layer 30a is formed in steps (A) and (B), and then the third impurity layer 30b is formed. Then by diffusing the impurity in the first impurity layer 20a and the third impurity layer 30b by a heat treatment in step (D), the first well 20 and the second well 30 having an impurity concentration higher than the first well 20 can be simultaneously formed.

In accordance with the present embodiment, in step (A), an anti-oxidation layer composed of the silicon nitride layer 14 having a mask function against oxidation is selectively formed on the semiconductor substrate 10. Then, an N-type impurity is introduced in the semiconductor substrate 10 using the silicon nitride layer 14 as a first mask to form the first impurity layer 20a and the second impurity layer 30a. Then, in step (B), an N-type impurity is further ion-implanted in a region of the second impurity layer 30a using the silicon nitride layer 14 and the resist layer R100 as a second mask to form the third impurity layer 30b.

In accordance with this method, the silicon nitride layer 14 can be used as part of the first mask and the second mask, such that the number of steps of forming masks can be reduced. Then, when the second impurity layer 30a and the third impurity layer 30b are formed, the silicon nitride layer 14 also serves as a mask at the time of introducing the impurity. Therefore, no mask deviation occurs in the impurity ion implantations that are conducted twice. Therefore, an impurity can be introduced in a specified region by ion implantations that are conducted multiple times, and the third impurity layer 30b can be formed with a high positional accuracy.

In accordance with the present embodiment, in step (C), the surface of the semiconductor substrate 10 is selectively oxidized by using the silicon nitride layer 14 as a mask to form the LOCOS layer 16. Then, after removing the silicon nitride layer 14, a P-type impurity is introduced in the semiconductor substrate 10 by using the LOCOS layer 16 as a mask, and a heat treatment is conducted to form the third well 40. By this method, the first well or the second well (the second well 30 in this example) and the third well 40, which form a twin-well, can be formed in a self-alignment manner.

Furthermore, in accordance with the present embodiment, by a heat treatment in step (D), the impurities of the first impurity layer 20a, the third impurity layer 30b and the impurity layer 40a are diffused such that the N-type first well 20, the N-type second well 30 and the P-type third well 40 are simultaneously formed, respectively.

The present invention is not limited to the embodiment described above, and many modifications can be made within the scope of the subject matter of the present invention. For example, the embodiment described above shows an example in which the first conductivity type is P-type and the second conductivity type is N-type. However, these conductivity types may be reversed if desired. Also, the layer structure or plan structure of the semiconductor device can be different from those of the embodiment described above.

The entire disclosure of Japanese Patent Application No. 2002-061878 filed Mar. 7, 2002 is incorporated by reference.

What is claimed is:

1. A method for manufacturing a semiconductor device, the method comprising:

selectively forming an anti-oxidation layer having a mask function against oxidation on a semiconductor substrate of a first conductivity type, wherein the anti-oxidation layer has a first opening and a second opening;

introducing an impurity of a second conductivity type in the semiconductor substrate using the anti-oxidation layer as a first mask to form a first impurity layer in the first opening and an independent second impurity layer in the second opening;

forming a resist layer on the anti-oxidation layer and in the first opening, wherein the resist layer has a third opening that corresponds to the second opening of the anti-oxidation layer, and wherein the third opening is larger than the second opening;

further introducing an impurity of the second conductivity type in a region of the second impurity layer using the anti-oxidation layer and the resist layer as a second mask to form a third impurity layer; and conducting a heat treatment to diffuse impurities of the first impurity layer and the third impurity layer to form a first well of the second conductivity type and a second well of the second conductivity type, the second well having an impurity concentration higher than that of the first well.

2. A method for manufacturing a semiconductor device according to claim 1, further comprising:

selectively oxidizing a surface of the semiconductor substrate using the anti-oxidation layer as a mask to form a LOCOS layer; and after removing the anti-oxidation layer, introducing an impurity of the first conductivity type in the semiconductor substrate using the LOCOS layer as a mask to form a third well in the semiconductor substrate.

3. A method for manufacturing a semiconductor device according to claim 2, further comprising forming a fourth well of the first conductivity type within the first well.

4. A method for manufacturing a semiconductor device according to claim 3, further comprising:

forming a low breakdown voltage transistor of the first conductivity type in the second well;

forming a low breakdown voltage transistor of the second conductivity type in the fourth well;

forming a high breakdown voltage transistor of the first conductivity type in the first well; and forming a high breakdown voltage transistor of the second conductivity type in the third well.

5. A method for manufacturing a semiconductor device according to claim 4, wherein a ratio of well depths of the first well and the fourth well is about 2 to 5.

* * * * *